United States Patent
Stille et al.

(10) Patent No.: US 12,421,610 B2
(45) Date of Patent: Sep. 23, 2025

(54) COMPONENT COMPRISING A STEEL SUBSTRATE, AN INTERMEDIATE LAYER AND AN ANTICORROSION COATING, CORRESPONDING HARDENED COMPONENT AND CORRESPONDING METHODS AND USES

(71) Applicant: ThyssenKrupp Steel Europe AG, Duisburg (DE)

(72) Inventors: Sebastian Stille, Dortmund (DE); Stefan Bienholz, Bochum (DE)

(73) Assignee: ThyssenKrupp Steel Europe AG, Duisburg (DE)

( * ) Notice: Subject to any disclaimer, the term of this patent is extended or adjusted under 35 U.S.C. 154(b) by 1009 days.

(21) Appl. No.: 17/439,645

(22) PCT Filed: Mar. 17, 2020

(86) PCT No.: PCT/EP2020/057329
§ 371 (c)(1),
(2) Date: Sep. 15, 2021

(87) PCT Pub. No.: WO2020/187929
PCT Pub. Date: Sep. 24, 2020

(65) Prior Publication Data
US 2022/0186383 A1    Jun. 16, 2022

(30) Foreign Application Priority Data
Mar. 19, 2019   (EP) .................................... 19163771

(51) Int. Cl.
| C23C 28/02 | (2006.01) |
| C22C 38/00 | (2006.01) |
| C22C 38/04 | (2006.01) |
| C23C 14/16 | (2006.01) |

(52) U.S. Cl.
CPC .......... C23C 28/025 (2013.01); C22C 38/002 (2013.01); C22C 38/04 (2013.01); C23C 14/16 (2013.01)

(58) Field of Classification Search
CPC .................................................. C23C 28/025
See application file for complete search history.

(56) References Cited

U.S. PATENT DOCUMENTS

| 5,776,617 | A | 7/1998 | Brady et al. |
| 2003/0196732 | A1 | 10/2003 | Carey, II et al. |
| 2008/0271823 | A1 | 11/2008 | Hofmann et al. |
| 2012/0129001 | A1 | 5/2012 | Schuhmacher et al. |
| 2014/0020795 | A1 | 1/2014 | Schwinghammer et al. |
| 2014/0170438 | A1 | 6/2014 | Baumgart et al. |
| 2016/0222484 | A1 | 8/2016 | Köyer et al. |
| 2017/0321314 | A1 | 11/2017 | Kolnberger et al. |

FOREIGN PATENT DOCUMENTS

| CN | 103547686 A | 1/2014 |
| DE | 102012024616 A1 | 6/2014 |
| DE | 102014004656 A1 | 10/2015 |
| EP | 2049699 B1 | 4/2009 |
| EP | 2435603 B1 | 4/2012 |
| EP | 2848709 A1 | 3/2015 |
| JP | 3277541 A | 12/1991 |
| JP | 6240432 A | 8/1994 |
| WO | 2004061159 A2 | 7/2004 |
| WO | 2014124749 A1 | 8/2014 |
| WO | 2015090621 A1 | 6/2015 |
| WO | 2016071399 A1 | 5/2016 |

OTHER PUBLICATIONS

English machine translation of DE 102014004656 A1 of Close (Year: 2015).*

* cited by examiner

*Primary Examiner* — Jophy S. Koshy
(74) *Attorney, Agent, or Firm* — The Webb Law Firm

(57) ABSTRACT

A component including a steel substrate having a structure that can be transformed into a martensitic structure, a metallic intermediate layer which covers the steel substrate and has a main constituent of titanium and an anticorrosion coating covering the intermediate layer, wherein the anticorrosion coating includes one or more layers and at least the layer of the anticorrosion coating adjoining the metallic intermediate layer is metallic and differs in terms of material from the intermediate layer.

11 Claims, 3 Drawing Sheets

COMPONENT COMPRISING A STEEL SUBSTRATE, AN INTERMEDIATE LAYER AND AN ANTICORROSION COATING, CORRESPONDING HARDENED COMPONENT AND CORRESPONDING METHODS AND USES

CROSS-REFERENCE TO RELATED APPLICATIONS

This application is the United States national phase of International Application No. PCT/EP2020/057329 filed Mar. 17, 2020, and claims priority to European Patent Application No. 19163771.9 filed Mar. 19, 2019, the disclosures of which are hereby incorporated by reference in their entirety.

BACKGROUND OF THE INVENTION

Field of the Invention

The present invention relates to a component comprising a steel substrate, a metallic intermediate layer covering the steel substrate and an anticorrosion coating covering the intermediate layer. The present invention additionally relates to a corresponding hardened component, a corresponding process for producing a component, a corresponding process for producing a hardened component and also uses according to the invention.

Description of Related Art

A component according to the invention is frequently present in the form of a steel sheet and preferably in the form of a PHS sheet (press-hardened steel sheet).

A hardened component according to the invention is preferably a shaped steel part which has been produced from a corresponding press-hardened steel sheet.

As regards the term "press-hardened steel sheet" (or "PHS sheet"), reference may be made to the document DE 10 2012 024 616 A1. As stated there, hardened components having extremely high strength can be made from press-hardened steel sheets by heating the steel sheet to above the austenitizing temperature and obtaining an essentially purely martensitic structure by cooling during pressing.

However, the present invention is not limited to the use of press-hardened steel sheet (as component) or to shaped steel parts produced therefrom (as hardened component).

For the purposes of the present invention, the steel substrate of the component and of the corresponding hardened component is preferably a manganese-boron steel. Anticorrosion coatings, for example Al—Si coatings, are usually employed in the hot forming of such manganese-boron steels in order to prevent scale formation on the surface. However, such Al—Si coatings protect against corrosion only passively due to their barrier action. The use of actively protecting Zn coatings is possible to only a limited extent because of the comparatively low melting point of pure zinc of 419° C. It has been observed that during forming, liquid zinc penetrates into the base material (the steel substrate) and there leads to crack formation (known as liquid metal embrittlement). This problem has in some cases already been circumvented by replacing the Zn coating with an alloy having a higher melting point, so that only a sufficiently small proportion of this alloy is present in liquid form during hot forming. In this respect, reference may again be made to the document DE 10 2012 024 616 A1. This discloses a steel sheet, in particular a press-hardened steel sheet, comprising a steel substrate layer and an anticorrosion layer containing zinc and manganese. The anticorrosion layer has been applied electrochemically to the substrate layer and has a proportion of manganese of at least 5% by weight, but not more than 25% by weight. According to the disclosure, a proportion of manganese of 25% by weight should not be exceeded.

However, it is generally the case that the sacrificial effect of an anticorrosion coating in the case of a Zn alloy is generally lower than that of pure zinc. When the coated steel substrate is heated, as occurs in hot forming which is typically carried out at about 900° C., there is also typically strong diffusion of iron into the coating composition (even at this juncture, reference may be made to the in-house studies as per FIG. 3). This inward diffusion typically decreases the cathodic protective action of the coating further.

Such iron diffusion is generally undesirable.

WO 2014/124749 discloses a coated steel substrate on which a metallic flash layer is arranged, with this metallic flash layer comprising a first flash layer which is adjacent to the steel substrate and contains one or more elements selected from among Al, Ag, Au, Cr, Cu, Mo, Ni, Sn and Zr, and a second flash layer which contains Fe as main constituent.

DE 10 2014 004 656 A1 discloses a component comprising a main element which is made of a hot-formable steel and is provided at least in a subregion with a coating comprising a first layer and at least one second layer which comprises at least zinc and is arranged on top of the first layer. The first layer is thus arranged between the main element and the second layer and is configured as barrier layer to prevent liquid metal embrittlement and diffusion. The first layer preferably comprises an oxide, nitride, sulfide, carbide, hydrate, silicate, chromate, molybdate, tungstate, vanadate, titanate, borate, carbonate, chloride or phosphate compound of a base metal.

EP 2 049 699 B1 relates to a process for coating steel strips and a coated steel strip. The steel strip has a manganese content in the range of 6-30%. Before the last heat treatment, an aluminum layer is applied to the steel strip and a coating composed of a molten metal is applied on top of the aluminum layer after the last heat treatment. The aluminum layer is preferably applied by PVD coating. The layer thickness of the intermediate layer is preferably limited to from 50 nm to 1000 nm. EP 2 049 699 B1 discloses that diffusion of the iron of the steel strip into the applied aluminum occurs during a heat treatment which is necessary before the subsequent melt coatings, so that a metallic overlay which consists essentially of Al and Fe and is joined by substance-to-substance bonding to the substrate formed by the steel strip is formed on the steel strip during the course of the heat treatment.

EP 2 435 603 B1 discloses a process for producing a flat steel product which is formed by a base layer consisting of a steel material and a multilayer coating which protects against corrosion applied thereto. A zinc layer is applied in a specific way to the base layer, a specific aluminum layer is applied to the surface of the zinc layer, a magnesium layer is applied on top of the aluminum layer, and a heat aftertreatment in which an $MgZn_2$ layer is formed in the coating above the Al layer in the direction of the surface of the coating is then carried out.

EP 2 848 709 A1 discloses a process for producing a steel component provided with a metallic coating which protects against corrosion, and a steel component.

WO 2016/071399 A1 discloses a process for producing an anticorrosion coating for hardenable steel sheets and an anticorrosion layer for hardenable steel sheets.

WO 2015/090621 A1 discloses a steel substrate which is provided with a zinc-based anticorrosion coating. A diffusion barrier layer, which can preferably be a tungsten layer or a tungsten alloy layer, can be arranged between the substrate and the zinc-based coating layer. It is disclosed that a comparatively thin barrier layer having a thickness in the range of 2-50 nm is sufficient.

Anticorrosion coatings and to some extent also intermediate layers or diffusion barrier layers for steel sheets (components) and hot-formed steel sheets (hardened components) are thus already known from the prior art. However, the anticorrosion coatings, intermediate layers, components and hardened components which are already known and the processes for producing each of them do not yet appear to be optimal.

In particular, there is a considerable need for components which have a steel substrate and an anticorrosion coating, with diffusion of iron from the steel substrate into the anticorrosion coating being at least largely prevented.

In addition, there is a considerable need for components in which the diffusion of elements of the anticorrosion coating into the steel substrate is particularly low.

In particular, there is a need for galvanized components which are effectively protected against damaging Zn infiltration during hot forming, known as liquid metal embrittlement, which is generally responsible for pronounced crack formation in the base material.

In addition, there is a need for corresponding components in which unlike those of, for example, WO 2015/090621 A1 no layers of a particularly brittle material (e.g. tungsten) are arranged on the steel substrate. Brittle layers tend to rupture during later hot forming; the resulting hardened steel sheets (hardened components) then have unacceptable cracks.

SUMMARY OF THE INVENTION

The various aspects of the present invention, which are linked to one another by a common technical teaching, relate to individual objectives or needs mentioned above or all of these objectives or needs.

According to a primary aspect of the present invention, which relates to a component (preferably a coated steel sheet), many of the abovementioned objects/problems are achieved/solved by a component comprising a steel substrate whose structure can be transformed into a martensitic structure,
a metallic intermediate layer which covers the steel substrate and whose main constituent is titanium
and
an anticorrosion coating covering the intermediate layer, wherein the anticorrosion coating comprises one or more layers and the one layer of the anticorrosion coating or at least the layer of the anticorrosion coating adjoining the metallic intermediate layer is metallic and differs in terms of its material from the intermediate layer.

The component of the invention is normally suitable for and intended for being processed further to give a hardened component according to the invention.

DESCRIPTION OF THE INVENTION

Figure 1:
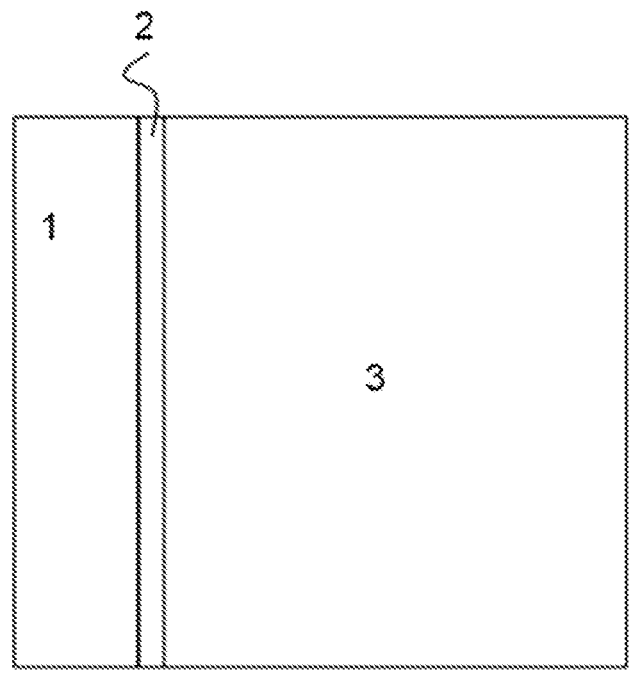
FIG. 1 schematically shows a component according to the invention.

The present invention is directed to a component (preferably a coated steel sheet) comprising: a steel substrate whose structure can be transformed into a martensitic structure, a metallic intermediate layer which covers the steel substrate and whose main constituent is titanium and an anticorrosion coating covering the intermediate layer, wherein the anticorrosion coating comprises one or more layers and the one layer of the anticorrosion coating or at least the layer of the anticorrosion coating adjoining the metallic intermediate layer is metallic and differs in terms of its material from the intermediate layer.

In the present text, a "metallic intermediate layer covering the steel substrate" is understood to mean an intermediate layer which is in direct contact with the steel substrate. In other words, no further intermediate layers of any kind are provided between the metallic intermediate layer and the steel substrate.

According to the invention, the main constituent of the metallic intermediate layer covering the steel substrate is titanium. This means that the proportion by mass of titanium in the metallic intermediate layer is greater than the proportion by mass of any other metal in the intermediate layer. The invention (in all its aspects) is based on the surprising recognition that a metallic intermediate layer which covers (contacts) the steel substrate and whose main constituent is titanium is an excellent diffusion barrier which greatly slows both the penetration of iron into the anticorrosion coating and also the penetration of elements of customary anticorrosion coatings for the purposes of process steps customary in the steel processing industry. The metallic intermediate layer provided according to the invention, whose main constituent is titanium, also does not contribute to increased brittleness of the component, as, for example, diffusion barriers composed of brittle metals such as tungsten do. Components according to the invention are thus largely protected against the unacceptable results of excessive diffusion of iron in the direction of the anticorrosion coating and of elements of the anticorrosion coating in the direction of the steel substrate and also against unacceptable embrittlement. Likewise, there is, for example, effective protection against damaging Zn infiltration, known as liquid metal embrittlement, which is frequently responsible for pronounced crack formation in the base material (steel substrate) when zinc is present in the anticorrosion coating.

Preference is given to a component according to the invention, wherein the main constituent of the metal atoms of the anticorrosion coating or the main constituent of the metal atoms of the metallic layer of the anticorrosion coating adjoining the metallic intermediate layer is selected from the group consisting of zinc and manganese
and/or
metallic zinc and/or metallic manganese are present in the one metallic layer of the anticorrosion coating or at least the metallic layer of the anticorrosion coating adjoining the metallic intermediate layer.

The elements zinc and manganese are customary metallic elements which are frequently used in anticorrosion coatings for steel sheets. The use of these is also preferred for the purposes of the present invention. Depending on the requirements of the individual case, the use of zinc or the use of manganese is preferred in some cases. In our own studies, components according to the invention have been found to be useful regardless of whether the main constituent of the metal atoms of the anticorrosion coating was zinc or manganese. Merely for reasons of simplicity, the following text focuses on the use of zinc; however, what is said in respect of zinc also applies correspondingly to the use of manganese.

In a component according to the invention (as described above, preferably as indicated as preferred above or below), the anticorrosion coating can in some places be in direct contact with the steel substrate despite the presence of a metallic intermediate layer (largely) covering the steel substrate. However, preference is given to a component according to the invention in which at least 90% of the area of the anticorrosion coating facing the steel substrate is separated from the steel substrate by the metallic intermediate layer, preferably at least 95% of the area, more preferably the entire area of the anticorrosion coating facing the steel substrate.

It goes without saying that the direct advantages of the presence according to the invention of the metallic intermediate layer which contains titanium as main constituent and covers the steel substrate come to bear where the anticorrosion coating is not in direct contact with the steel substrate. For this reason, a person skilled in the art will generally take care to ensure that a large proportion of the area of the anticorrosion coating facing the steel substrate is separated from the steel substrate by the intermediate layer.

Preference is given to a component according to the invention (as described above, preferably as indicated as preferred above) in which the steel substrate is a manganese-boron steel and/or a steel having a ferritic-pearlitic structure, preferably a manganese-boron steel having a ferritic-pearlitic structure, particularly preferably a manganese-boron steel having a ferritic-pearlitic structure which can be transformed by a thermal hardening treatment into a martensitic structure, very particularly preferably a manganese-boron steel having a ferritic-pearlitic structure and a proportion of manganese of less than 5% by weight, preferably from 0.7 to 2% by weight, which can be transformed by a thermal hardening treatment into a martensitic structure.

For the purposes of the present invention, it is particularly advantageous for the steel used as steel substrate of a component according to the invention to be a manganese-boron steel (preferably having a ferritic-pearlitic structure) which has a composition defined as follows:
0.04-0.4% by weight of C, 1.0-2.5% by weight of Mn, 0.06-0.9% by weight of Si, up to 0.03% by weight of P, up to 0.01% by weight of S, up to 0.1% by weight of Al, up to 0.15% by weight of Ti, up to 0.6% by weight of Nb, up to 0.005% by weight of B, up to 0.5% by weight of Cr, up to 0.5% by weight of Mo, where the sum of the contents of Cr and Mo is not more than 0.5% by weight, balance iron and unavoidable impurities.

Particular preference is given to steel substrates (having a preferably ferritic-pearlitic structure) whose composition is defined as follows:
0.07-0.4% by weight of C, 1.0-2% by weight of Mn, 0.06-0.4% by weight of Si, up to 0.03% by weight of P, up to 0.01% by weight of S, up to 0.1% by weight of Al, up to 0.15% by weight of Ti, up to 0.6% by weight of Nb, up to 0.005% by weight of B, up to 0.5% by weight of Cr, up to 0.5% by weight of Mo, where the sum of the contents of Cr and Mo is not more than 0.5% by weight, balance iron and unavoidable impurities.

Very particular preference is given to steel substrates (having a preferably ferritic-pearlitic structure) which are defined as follows:
0.07-0.4% by weight of C, 1.0-1.5% by weight of Mn, 0.3-0.4% by weight of Si, up to 0.03% by weight of P, up to 0.01% by weight of S, up to 0.05% by weight of Al, up to 0.15% by weight of Ti, up to 0.6% by weight of Nb, up to 0.005% by weight of B, up to 0.5% by weight of Cr, up to 0.5% by weight of Mo, where the sum of the contents of Cr and Mo is not more than 0.5% by weight, balance iron and unavoidable impurities.

The steel material used for the steel substrate can be employed both in pure form and also in combination in the form of layers (3-5 layers, metal sheets on top of one another which have previously been joined by a rolling process to give a steel strip) or joined steel sheets (e.g. combination of two steel strips next to one another which are joined by, for example, a laser welding seam to give one steel strip) or in the form of plates/tailored blanks.

The thickness of the steel substrate is preferably in the range from 0.6 mm to 7 mm, more preferably in the range from 0.8 to 4 mm and particularly preferably in the range from 0.8 to 3 mm. However, other thicknesses can be selected depending on the requirements of the individual case.

A proportion of manganese above 5% by weight in the steel substrate is not preferred for the purposes of the present invention; cf. what has been said above in respect of preferred embodiments.

Preference is given to using steel substrates which are suitable and intended for hot forming. For this reason, steel substrates having yield points in the range 250-580 MPa and/or tensile strengths in the range 400-720 MPa are preferred.

Preference is given to a component according to the invention (preferably a component according to the invention as is indicated as preferred above) in which the proportion of titanium in the metallic intermediate layer covering the steel substrate is greater than or equal to 90% by weight, based on the total mass of the intermediate layer.

Surprisingly, a particularly effective diffusion barrier action can be achieved using metallic intermediate layers whose main constituent is titanium and in which the proportion of titanium is preferably greater than or equal to 90% by weight; cf. the examples further below in the text.

Preference is given to a component according to the invention (preferably as indicated as preferred above), wherein the material of the metallic intermediate layer which covers the steel substrate and whose main constituent is titanium has a melting point which is greater than 1000° C., preferably greater than 1200° C., more preferably greater than 1400° C., particularly preferably greater than 1600° C., and/or has a boiling point which is less than 4700° C., preferably less than 3500° C. Especially for application of metallic intermediate layers to a steel substrate by PVD processes, the material of the intermediate layer should have one of the boiling points indicated above which is less than 3500° C.

Preference is given to a component according to the invention (preferably as indicated as preferred above), wherein (i) metallic zinc is present in the one metallic layer of the anticorrosion coating or at least the metallic layer of the anticorrosion coating adjoining the metallic intermediate layer and the proportion of metallic zinc in the anticorrosion coating covering the intermediate layer is greater than or equal to 55% by weight, preferably greater than or equal to 96% by weight, based on the total mass of the anticorrosion coating, and/or the melting point of the anticorrosion coating or the melting point of the one metallic layer of the anticorrosion coating or at least the metallic layer of the anticorrosion coating adjoining the metallic intermediate layer is greater than or equal to 419° C., preferably either in the range from 419° C. to 580° C. or in the range above 600° C., or even (and this can be achieved by, in particular, the presence of manganese in the anticorrosion coating)

(ii) the melting point of the anticorrosion coating or the melting point of the one metallic layer of the anticorrosion coating or at least the metallic layer of the anticorrosion coating adjoining the metallic intermediate layer is greater than or equal to 880° C.

Advantageous technical effects which are largely independent of the melting point of the anticorrosion coating or of the melting point of the one metallic layer of the anticorrosion coating or at least the metallic layer of the anticorrosion coating adjoining the metallic intermediate layer are surprisingly linked to the use according to the invention of a metallic intermediate layer whose main constituent is titanium. Since components according to the invention are normally intended for the purpose of hot forming at a temperature of greater than or equal to 880° C., metallic layers having a low proportion of Zn (and thus preferably a high proportion of Mn) are in many cases economically more interesting than layers having a high proportion of Zn. However, the technical effect of the present invention is not achieved in every case.

Preference is in many cases also given to a component (preferably as indicated as preferred above) in which the anticorrosion coating comprises a proportion of manganese which based on the total mass of the anticorrosion coating, is in the range from 15 to 40% by weight and/or based on the total mass of manganese and zinc in the anticorrosion coating, is greater than or equal to 27%, preferably greater than or equal to 30%, and/or is less than 40%, preferably less than 35%, and/or is in the range from >25% to 40%, preferably in the range from >25% to 35%, particularly preferably in the range from 27% to 35%.

Such anticorrosion coatings normally have a high melting point and are therefore particularly suitable for hot forming processes.

Preference is given to a component according to the invention (preferably as indicated as preferred above) in which the metallic intermediate layer, whose main constituent is titanium, has a thickness of not more than 500 nm, preferably a thickness of not more than 400 nm, particularly preferably a thickness of not more than 300 nm, and/or the metallic intermediate layer, whose main constituent is titanium, has a thickness of at least 100 nm, preferably at least 150 nm.

The metalic intermediate layer (having titanium as main constituent) of a component according to the invention functions effectively as diffusion barrier, even when it has a very low layer thickness. Even a few atomic layers, i.e. a thickness of, for example, only 1 nm, effectively contribute to the diffusion barrier action. At thicknesses of more than 500 nm, our studies have usually shown no relevant technical difference, so that metallic intermediate layers having a thickness of 500 nm are advantageous only in exceptional cases.

Preference is given to a component according to the invention (preferably as indicated as preferred above) in which the anticorrosion coating has a thickness of at least 1 μm, preferably a thickness in the range from 3 μm to 50 μm, particularly preferably a thickness in the range from 5 μm to 30 μm, very particularly preferably in the range from 7 μm to 20 μm.

Such thicknesses are set in a customary manner by a person skilled in the art.

Preference is given to a component according to the invention (preferably as indicated as preferred above) in which the metallic intermediate layer which covers the steel substrate and whose main constituent is titanium and/or the anticorrosion coating covering the intermediate layer has or have been applied by physical vapor deposition.

An advantage of the present invention is that both the metallic intermediate layer and the anticorrosion coating covering the intermediate layer can be applied by physical vapor deposition (PVD). The use of PVD processes is preferred for the purposes of the present invention.

The present invention also provides a hardened component comprising a steel substrate an anticorrosion coating protecting the steel substrate, wherein the anticorrosion coating comprises titanium, preferably metallic titanium.

A hardened component according to the invention has preferably been produced from a component according to the invention (preferably as indicated as preferred above).

In the conversion of a component according to the invention into a hardened component according to the invention (cf. what is said further below with regard to processes according to the invention), titanium migrates to a certain extent from the material of the metallic intermediate layer into the material of the anticorrosion coating. This results in an anticorrosion coating which protects the steel substrate and also comprises titanium, preferably metallic titanium. This is a significant difference from anticorrosion coatings known from the prior art. The diffusion barrier action of the metallic intermediate layer (which, in particular, counters the diffusion of iron into the anticorrosion coating and the diffusion of zinc and/or manganese into the steel substrate) is surprisingly excellent despite the migration of titanium into the material of the anticorrosion coating during customary hot forming processes starting from a still unhardened component to form a hardened component.

Preference is given to a hardened component according to the invention which is obtainable by hardening a component according to the invention (preferably as indicated as preferred above)
and/or
is a hot-formed hardened component.

A hardened component which has been obtained by hardening a component according to the invention by means of hot forming is thus particularly preferred.

Preference is given to a hardened component according to the invention (preferably as indicated as preferred above) in which the steel substrate predominantly has a martensitic structure. This means that other structures/phases can also be present, especially where appreciable proportions of zinc, manganese or titanium are present in the steel substrate due to convective or diffusion processes.

The martensitic structure which is present in the steel substrate in preferred hardened components according to the invention can be produced in a conventional manner from a ferritic-pearlitic steel substrate by hot forming processes known to a person skilled in the art.

Preference is given to a hardened component according to the invention (preferably as indicated as preferred above) in which the steel substrate is alloyed with titanium, preferably alloyed with titanium and at least one metal selected from the group consisting of zinc and manganese, in a zone facing the anticorrosion coating.

Such a hardened component is obtained especially when, starting out from a component according to the invention, titanium diffuses to a certain (small) extent from the metallic intermediate layer into the steel substrate, or zinc and/or manganese also diffuse together with the titanium into the steel substrate (zinc and manganese are, according to what has been said above, preferred metals for the anticorrosion coating), during hot forming. The presence of titanium, zinc and/or manganese usually does not change the fact that the structure of the steel substrate is martensitic in a (preferred) hardened component according to the invention. As indicated above, a martensitic structure is preferred; a martensitic structure in the steel substrate, where the steel substrate is alloyed with titanium, zinc and/or manganese in the zone facing the anticorrosion coating, is therefore particularly preferred.

Preference is given to a hardened component according to the invention (preferably as indicated as preferred above), wherein the steel substrate and the anticorrosion coating are joined by a transition zone
  in which iron, titanium and the metallic main constituent of the anticorrosion coating are present, wherein a change of the metallic main constituent from iron to the metallic main constituent of the anticorrosion coating occurs going out from a region of the transition zone close to the steel substrate in the direction of the anticorrosion coating, wherein the main constituent of the anticorrosion coating is preferably selected from the group consisting of zinc and manganese,
and/or
  in which the proportion by mass of iron, going out from a region of the transition zone close to the steel substrate in the direction of the anticorrosion coating, decreases from a first proportion by mass to half or less than half of the first proportion over a distance of not more than 10 µm, preferably 5 µm, wherein the first proportion by mass of iron in the region of the transition zone close to the steel substrate is preferably at least 80% by weight.

Surprisingly, hardened components according to the invention which have a transition zone having one or both of the above-defined properties can be produced by processes according to the invention. In said transition zone, the metallic main constituent therefore changes and/or the proportion by mass of iron decreases over only a very short distance of not more than 10 µm in the preferred hardened components. These properties of the (very narrow) transition zone can be attributed to the excellent diffusion barrier action of the metallic intermediate layer based on titanium which is present in the (still unhardened) component according to the invention.

Preference is given to a hardened component according to the invention (preferably as indicated as preferred above), wherein the proportion of iron is less than 25% by weight, preferably less than 20% by weight, determined by means of GDOES, at a depth of 2 µm, preferably in the range from 1 to 3 µm, in the anticorrosion coating, measured from the outer surface of the anticorrosion coating. Thus, hardened components according to the invention in which iron does not migrate to a significant extent into the anticorrosion coating during production and during any after-treatments are preferred. The determination of the proportion of iron by means of GDOES is carried out in accordance with the ISO standard 11505:2012 ("Surface chemical analysis—General procedure for quantitative compositional depth profiling by glow discharge optical emission spectrometry"). In this measurement method, a plasma is produced by application of a high voltage to a glow discharge lamp flushed with argon gas. With the aid of the plasma, ions are firstly produced for a sputtering process (in order to remove the surface to be examined) and secondly the atoms removed are excited so as to emit radiation. The emitted light is spectrally analyzed in a polychromator and the light intensity is converted by photomultipliers into electrical signals. These signals are subsequently digitized and evaluated in a PC-assisted control and evaluation unit.

Preference is given to a hardened component according to the invention (preferably as indicated as preferred above), wherein there is a maximum of the proportion by mass of titanium at a depth of >0 µm, preferably at a depth in the range from 2 to 20 µm, measured from the outer surface of the anticorrosion coating, in the proportion by mass-depth graph (quantitative depth profile).

Even though titanium usually diffuses to a certain extent into the anticorrosion coating during production of a hardened component according to the invention from a (still unhardened) component, for example by means of hot forming, no state in which the titanium concentration at the outer surface of the anticorrosion layer is as high as within the hardened component is approached or reached, which is advantageous.

The present invention also provides a process for producing a component, preferably for producing a component according to the invention (preferably as indicated as preferred above). A process according to the invention comprises the following steps:
  production or provision of a steel substrate, where the structure of the steel substrate can be transformed into a martensitic structure, application of (i) titanium or (ii) titanium and one or more further metals to the steel substrate so as to result in a metallic intermediate layer which covers the steel substrate and whose main constituent is titanium, application of one or more metals to the metallic intermediate layer so as to result in an anticorrosion coating covering the intermediate layer.

As regards preferred steel substrates and preferred metals for forming the anticorrosion coating covering the intermediate layer and preferred properties of the resulting component, what has been said above applies analogously. Conversely, all statements made above or below in connection with the process of the invention apply analogously to the components or hardened components of the invention.

Overall, for all aspects of the invention explained in the context of the present text, it is the case that preferred embodiments which are presented for one of these aspects also apply with the appropriate changes to the other aspects.

The application of titanium or titanium and one or more further metals to the steel substrate and the application of one or more metals to the metallic intermediate layer can be carried out in various ways. Preference is given to a process according to the invention in which the application of the single-layer or multilayer metallic layer is carried out by a process selected from the group consisting of electrolytic deposition, electroplating, physical vapor deposition, chemical vapor deposition, dipping processes, slurry processes, thermal spraying and combinations thereof, preferably electrolytically or by means of physical vapor deposition and particularly preferably by means of physical vapor deposition.

As indicated above, the main constituent of an anticorrosion coating in a component according to the invention is preferably zinc or manganese. Accordingly, preference is given to a process according to the invention (preferably as indicated as preferred above) which comprises the step:

application of (i) zinc or (ii) zinc and one or more further metals to the metallic intermediate layer so as to result in an anticorrosion coating which covers the intermediate layer and whose main constituent is zinc or application of (i) manganese or (ii) manganese and one or more further metals to the metallic intermediate layer so as to result in an anticorrosion coating which covers the intermediate layer and whose main constituent is manganese.

Preference is given to a process according to the invention (preferably as indicated as preferred above), wherein the application of (i) titanium or (ii) titanium and one or more further metals to the steel substrate and the application of one or more further metals to the metallic intermediate layer is carried out in such a way that at least 90% of the area of the anticorrosion coating facing the steel substrate is separated from the steel substrate by the metallic intermediate layer, preferably at least 95%, particularly preferably the entire area facing the steel substrate.

The advantages and effects presented above in connection with the corresponding preferred component according to the invention apply.

Preference is given to a process according to the invention (preferably as indicated as preferred above), in which the steel substrate is a manganese-boron steel and/or a steel having a ferritic-pearlitic structure, preferably a manganese-boron steel having a ferritic-pearlitic structure, particularly preferably a manganese-boron steel having a ferritic-pearlitic structure which can be transformed by a thermal hardening treatment into a martensitic structure, very particularly preferably a manganese-boron steel having a ferritic-pearlitic structure and a proportion of manganese of less than 5% by weight, preferably from 0.7 to 2% by weight, which can be transformed into a martensitic structure by a thermal hardening treatment.

The effects and advantages presented above in connection with the component of the invention are also achieved here.

Preference is given to a process according to the invention (preferably as indicated as preferred above), wherein the proportion of titanium in the application of (i) titanium or (ii) titanium and one or more further metals to the steel substrate is selected so that the proportion of titanium in the resulting metallic intermediate layer covering the steel substrate is greater than or equal to 90% by weight, based on the total mass of the intermediate layer.

The effects and advantages presented above in connection with the component according to the invention are also achieved here.

Preference is given to a process according to the invention (preferably as indicated as preferred above), wherein the type and amount of the metals to be applied to produce the metallic intermediate layer are selected so that the material of the resulting metallic intermediate layer which covers the steel substrate and whose main constituent is titanium has a melting point which is greater than 1000° C., preferably greater than 1200° C., preferably greater than 1400° C., particularly preferably greater than 1600° C., and/or has a boiling point which is less than 4700° C., preferably less than 3500° C.

What has been said above applies analogously.

Particular preference is given to a process according to the invention (preferably as indicated as preferred above), wherein the proportion of zinc in the application of (i) zinc or (ii) zinc and or more further metals to the metallic intermediate layer is selected so that the proportion of zinc in the anticorrosion coating covering the intermediate layer is greater than or equal to 55% by weight, based on the total weight of the anticorrosion coating, or the proportion of manganese in the application of (i) manganese or (ii) manganese and one or more further metals to the metallic intermediate layer is selected so that the melting point of the anticorrosion coating or the melting point of the one metallic layer of the anticorrosion coating or at least the metallic layer of the anticorrosion coating adjoining the metallic intermediate layer is greater than or equal to 880° C.

Preference is given to a process according to the invention (preferably as indicated as preferred above) comprising the application of (ii) zinc and manganese and optionally one or more further metals to the metallic intermediate layer so as to result in an anticorrosion coating which covers the intermediate layer and whose main constituent is zinc and which comprises manganese, wherein the amount of zinc and manganese and of any further metal(s) to be applied is preferably selected so that the resulting anticorrosion coating comprises a proportion of manganese which based on the total mass of the resulting anticorrosion coating, is in the range from 15 to 40% by weight and/or based on the total mass of manganese and zinc in the resulting anticorrosion coating is greater than or equal to 27%, preferably greater than or equal to 30%,
and/or
is less than 40%, preferably less than 35%,
and/or
is in the range from >25% to 40%, preferably in the range from >25% to 35%, particularly preferably in the range from 27% to 35%.

What has been said above applies analogously.

Preference is given to a process according to the invention (preferably as indicated as preferred above), wherein
the resulting metallic intermediate layer, whose main constituent is titanium, has a thickness of not more than 500 nm, preferably a thickness of not more than 400 nm, particularly preferably a thickness of not more than 300 nm,
and/or
the resulting metallic intermediate layer, whose main constituent is titanium, has a thickness of at least 100 nm, preferably at least 150 nm.

What has been said above applies analogously.

Preference is given to a process according to the invention (preferably as indicated as preferred above), wherein the resulting anticorrosion coating, whose main constituent is zinc, has a thickness of at least 1 µm, preferably a thickness in the range from 3 µm to 50 µm, more preferably a thickness in the range from 5 µm to 30 µm, particularly preferably in the range from 7 µm to 20 µm.

What has been said above applies analogously.

Preference is given to a process according to the invention (preferably as indicated as preferred above), wherein
the application of (i) titanium or (ii) titanium and one or more further metals to the steel substrate so as to result in a metallic intermediate layer which covers the steel substrate and whose main constituent is titanium
and/or
the application of one or more further metals to the metallic intermediate layer so as to result in an anticorrosion coating covering the intermediate layer
is carried out by physical vapor deposition. This physical vapor deposition is preferably carried out
at a partial pressure of oxygen of less than 0.1 mbar, preferably less than 0.01 mbar, particularly preferably less than 0.001 mbar,
and/or
in a gas phase in which the proportion by volume of oxygen is less than 20% by volume, preferably less than 10% by volume, particularly preferably less than 1% by volume.

The invention also provides a process for producing a hardened component, comprising the following steps:
provision of a component according to the invention or production of a component by a process according to the invention,
treatment of the component provided or produced so as to result in the hardened component.

What has been said above in respect of preferred components, processes and hardened components according to the invention applies analogously.

Preference is thus given to such a process according to the invention (preferably as indicated as preferred above), wherein the component provided or produced comprises, as steel substrate, a steel having a structure which can be transformed into a martensitic structure, preferably comprises a steel having a ferritic-pearlitic structure, particularly preferably a manganese-boron steel having a ferritic-pearlitic structure, and the treatment comprises: a thermal hardening treatment in which the structure is transformed into a martensitic structure,
and preferably
a mechanical treatment, preferably mechanical forming, before, during and/or after the thermal hardening treatment (preferably during).

Preference is given to such a process according to the invention (preferably as indicated as preferred above), wherein the treatment
comprises at least the following steps:
(i) a thermal treatment in which the structure of the steel substrate of the component provided or produced is kept at a temperature above Ac3 until the structure has been transformed completely or partially into an austenitic structure,
(ii) mechanical forming of the component before, during and/or after the thermal treatment,
(iii) cooling of the component from the temperature above Ac3 during and/or after the mechanical forming, preferably to a temperature of less than 100° C., so that a martensitic structure is obtained in the steel substrate, preferably at a cooling rate of >20 K/s,
and/or
comprises the following step:
mechanical treatment in which the porosity of the anticorrosion coating and/or of the metallic intermediate layer is decreased.

The present invention also provides for the use of titanium as main constituent of a diffusion barrier between a steel substrate whose structure can be transformed into a martensitic structure and an anticorrosion coating whose main constituent is zinc or manganese (preferably zinc). It has surprisingly been found that the use of titanium as main constituent of a diffusion barrier, which has hitherto not been known from the prior art, leads to particularly excellent results and technical effects. These are reflected in drastically decreased diffusion, in particular during hot forming processes starting out from a component according to the invention to give a hardened component according to the invention.

The advantages indicated in connection with components according to the invention, hardened components according to the invention and processes according to the invention and the technical effects presented there apply analogously to the use according to the invention. Preference is given to a use according to the invention in a process for producing a hardened, preferably press-hardened, component, preferably a press-hardened component of a motor vehicle, particularly preferably a press-hardened component selected from the group consisting of bumper cross beams, side impact beams, columns and bodywork reinforcements.

Finally, the present invention also provides for the use of a component according to the invention for producing a hardened component according to the invention.

Preferred aspects of the present invention are indicated below; the reference numerals relate to the accompanying drawings which are also explained in more detail below.

1. Component comprising
    a steel substrate (3) whose structure can be transformed into a martensitic structure,
    a metallic intermediate layer (2) which covers the steel substrate and whose main constituent is titanium
    and
    an anticorrosion coating (1) covering the intermediate layer (2),
wherein the anticorrosion coating (1) comprises one or more layers and the one layer of the anticorrosion coating (1) or at least the layer of the anticorrosion coating (1) adjoining the metallic intermediate layer (2) is metallic and differs in terms of its material from the intermediate layer (2).

2. Component according to aspect 1, wherein
the main constituent of the metal atoms of the anticorrosion coating (1) or the main constituent of the metal atoms of the metallic layer of the anticorrosion coating (1) adjoining the metallic intermediate layer (2) is selected from the group consisting of zinc and manganese
and/or
metallic zinc and/or metallic manganese are present in the one metallic layer of the anticorrosion coating (1) or at least the metallic layer of the anticorrosion coating (1) adjoining the metallic intermediate layer (2).

3. Component according to either of the preceding aspects, wherein at least 90% of the area of the anticorrosion coating (1) facing the steel substrate (3) is separated from the steel substrate (3) by the metallic intermediate layer (2), preferably at least 95% of the area, more preferably the entire area facing the steel substrate (3).

4. Component according to any of the preceding aspects, wherein the steel substrate (3) is a manganese-boron steel and/or a steel having a ferritic-pearlitic structure,
preferably a manganese-boron steel having a ferritic-pearlitic structure,
particularly preferably a manganese-boron steel having a ferritic-pearlitic structure which can be transformed by thermal hardening treatment into a martensitic structure,
very particularly preferably a manganese-boron steel having a ferritic-pearlitic structure and a proportion of manganese of less than 5% by weight, preferably from 0.7 to 2% by weight, which can be transformed by a thermal hardening treatment into a martensitic structure.

5. Component according to any of the preceding aspects, wherein the proportion of titanium in the metallic intermediate layer (2) covering the steel substrate (3) is greater than or equal to 90% by weight, based on the total mass of the intermediate layer (2).

6. Component according to any of the preceding aspects, wherein the material of the metallic intermediate layer (2) which covers the steel substrate and whose main constituent is titanium,
has a melting point which is greater than 1000° C., preferably greater than 1200° C., preferably greater than 1400° C., particularly preferably greater than 1600° C.,
and/or
has a boiling point which is less than 4700° C., preferably less than 3500° C.

7. Component according to any of the preceding aspects, wherein
(i) metallic zinc is present in the one metallic layer of the anticorrosion coating (1) or at least the metallic layer of the anticorrosion coating (1) adjoining the metallic intermediate layer (2) and
the proportion of metallic zinc in the anticorrosion coating (1) covering the intermediate layer is greater than or equal to 55% by weight, preferably greater than or equal to 96% by weight, based on the total mass of the anticorrosion coating,
and/or
the melting point of the anticorrosion coating or the melting point of the one metallic layer of the anticorrosion coating (1) or at least the metallic layer of the anticorrosion coating (1) adjoining the metallic intermediate layer (2) is greater than or equal to 419° C., preferably either in the range from 419° C. to 580° C. or in the range above 600° C.,
or
(ii) the melting point of the anticorrosion coating or the melting point of the one metallic layer of the anticorrosion coating (1) or at least the metallic layer of the anticorrosion coating (1) adjoining the metallic intermediate layer (2) is greater than or equal to 880° C.

8. Component according to any of the preceding aspects, wherein the anticorrosion coating (1) comprises a proportion of manganese which
based on the total mass of the anticorrosion coating, is in the range from 15 to 40% by weight
and/or
based on the total mass of manganese and zinc in the anticorrosion coating is greater than or equal to 27%, preferably greater than or equal to 30%,
and/or
is less than 40%, preferably less than 35%,
and/or
is in the range from >25% to 40%, preferably in the range from >25% to 35%, particularly preferably in the range from 27% to 35%.

9. Component according to any of the preceding aspects, wherein
the metallic intermediate layer (2), whose main constituent is titanium, has a thickness of not more than 500 nm, preferably a thickness of not more than 400 nm, particularly preferably a thickness of not more than 300 nm,
and/or
the metallic intermediate layer (2), whose main constituent is titanium, has a thickness of at least 100 nm, preferably at least 150 nm.

10. Component according to any of the preceding aspects, wherein the anticorrosion coating (1) has a thickness of at least 1 μm, preferably a thickness in the range from 3 μm to 50 μm, particularly preferably a thickness in the range from 5 μm to 30 μm, very particularly preferably in the range from 7 μm to 20 μm.

11. Component according to any of the preceding aspects, wherein
the metallic intermediate layer (2) which covers the steel substrate and whose main constituent is titanium
and/or
the anticorrosion coating (1) covering the intermediate layer
has/have been applied by physical vapor deposition.

12. Hardened component comprising
a steel substrate (6) and
an anticorrosion coating (4) protecting the steel substrate, wherein the anticorrosion coating comprises titanium, preferably metallic titanium.

13. Hardened component according to aspect 12, wherein the hardened component is obtainable by hardening a component according to any of aspects 1 to 11
and/or
is a hot-formed hardened component.

14. Hardened component according to either of aspects 12 and 13, wherein the steel substrate (6) predominantly has a martensitic structure.

15. Hardened component according to any of aspects 12 to 14, wherein the steel substrate (6) is alloyed with titanium, preferably alloyed with titanium and at least one metal selected from the group consisting of zinc and manganese, in a zone facing the anticorrosion coating (4).

16. Hardened component according to any of aspects 12 to 15, wherein the steel substrate (6) and the anticorrosion coating (4) are joined by a transition zone (5)
    in which iron, titanium and the metallic main constituent of the anticorrosion coating are present, wherein a change of the metallic main constituent from iron to the metallic main constituent of the anticorrosion coating occurs going out from a region of the transition zone close to the steel substrate in the direction of the anticorrosion coating, wherein the main constituent of the anticorrosion coating is preferably selected from the group consisting of zinc and manganese,
    and/or
    in which the proportion by mass of iron, determined by means of GDOES, going out from a region of the transition zone (5) close to the steel substrate (6) in the direction of the anticorrosion coating (4) decreases from a first proportion by mass to half or less than half of the first proportion over a distance of not more than 10 μm, preferably 5 μm, wherein the first proportion by mass of iron in the region of the transition zone (5) close to the steel substrate (6) is preferably at least 80% by weight.

17. Hardened component according to any of aspects 12 to 16, wherein the proportion of iron at a depth of 2 μm, preferably in the range from 1 to 3 μm, in the anticorrosion coating (4), measured from the outer surface of the anticorrosion coating, is less than 25% by weight, preferably less than 20% by weight, determined by means of GDOES.

18. Hardened component according to any of aspects 12 to 17, wherein there is a maximum of the proportion by mass of titanium, determined by means of GDOES, at a depth of >0 μm, preferably at a depth in the range from 2 to 20 μm, measured from the outer surface of the anticorrosion coating (4), in the proportion by mass-depth graph.

19. Process for producing a component, preferably a component according to any of aspects 1 to 12, comprising the following steps:
    production or provision of a steel substrate (3), where the structure of the steel substrate can be transformed into a martensitic structure,
    application of (i) titanium or (ii) titanium and one or more further metals to the steel substrate so as to result in a metallic intermediate layer (2) which covers the steel substrate and whose main constituent is titanium,
    application of one or more metals to the metallic intermediate layer so as to result in an anticorrosion coating (1) covering the intermediate layer.

20. Process according to aspect 19, comprising the step
    application of (i) zinc or (ii) zinc and one or more further metals to the metallic intermediate layer so as to result in an anticorrosion coating (1) which covers the intermediate layer and whose main constituent is zinc
    or
    application of (i) manganese or (ii) manganese and one or more further metals to the metallic intermediate layer so as to result in an anticorrosion coating (1) which covers the intermediate layer and whose main constituent is manganese.

21. Process according to aspect 19 or 20, wherein the application of (i) titanium or (ii) titanium and one or more further metals to the steel substrate (3) and the application of one or more further metals to the metallic intermediate layer (2) is carried out in such a way that at least 90% of the area of the anticorrosion coating (1) facing the steel substrate is separated from the steel substrate (3) by the metallic intermediate layer (2), preferably at least 95%, particularly preferably the entire area facing the steel substrate (3).

22. Process according to any of aspects 19 to 21, wherein the steel substrate (3) is a manganese-boron steel and/or a steel having a ferritic-pearlitic structure, preferably is a manganese-boron steel having a ferritic-pearlitic structure, particularly preferably is a manganese-boron steel having a ferritic-pearlitic structure which can be transformed by a thermal hardening treatment into a martensitic structure, very particularly preferably is a manganese-boron steel having a ferritic-pearlitic structure and a proportion of manganese of less than 5% by weight, preferably from 0.7 to 2% by weight, which can be transformed by a thermal hardening treatment into a martensitic structure.

23. Process according to any of aspects 19 to 22, wherein the proportion of titanium in the application of (i) titanium or (ii) titanium and one or more further metals to the steel substrate (3) is selected so that the proportion of titanium in the resulting metallic intermediate layer (2) covering the steel substrate (3) is greater than or equal to 90% by weight, based on the total mass of the intermediate layer (2).

24. Process according to any of aspects 19 to 23, wherein the type and amount of the metals to be applied for producing the metallic intermediate layer (2) are selected so that the material of the resulting metallic intermediate layer (2) which covers the steel substrate (3) and whose main constituent is titanium
    has a melting point which is greater than 1000° C., preferably greater than 1200° C., more preferably greater than 1400° C., particularly preferably greater than 1600° C.,
    and/or
    has a boiling point which is less than 4700° C., preferably less than 3500° C.

25. Process according to any of aspects 19 to 24, wherein
    the proportion of zinc in the application of (i) zinc or (ii) zinc and one or more further metals to the metallic intermediate layer (2) is selected so that the proportion of zinc in the anticorrosion coating (1) covering the intermediate layer (2) is greater than or equal to 55% by weight, based on the total mass of the anticorrosion coating,
    or
    the proportion of manganese in the application of (i) manganese or (ii) manganese and one or more further metals to the metallic intermediate layer (2) is selected so that the melting point of the anticorrosion coating or the melting point of the one metallic layer of the anticorrosion coating (1) or at least the metallic layer of the anticorrosion coating (1) adjoining the metallic intermediate layer (2) is greater than or equal to 880° C.

26. Process according to any of aspects 19 to 25, comprising the application of (ii) zinc and manganese and optionally one or more further metals to the metallic intermediate layer so as to result in an anticorrosion coating (1) which covers the intermediate layer and whose main constituent is zinc and which comprises manganese,
    wherein the amount of zinc and manganese and any further metal(s) to be applied is preferably selected so that the resulting anticorrosion coating (1) comprises a proportion of manganese which
        based on the total mass of the resulting anticorrosion coating (1), is in the range from 15 to 40% by weight
        and/or
        based on the total mass of manganese and zinc in the resulting anticorrosion coating (1)

is greater than or equal to 27%, preferably greater than or equal to 30%, and/or is less than 40%, preferably less than 35%, and/or is in the range from >25% to 40%, preferably in the range from >25% to 35%, particularly preferably in the range from 27% to 35%.

27. Process according to any of aspects 19 to 26, wherein the resulting metallic intermediate layer (2), whose main constituent is titanium, has a thickness of not more than 500 nm, preferably a thickness of not more than 400 nm, particularly preferably a thickness of not more than 300 nm, and/or the resulting metallic intermediate layer (2), whose main constituent is titanium, has a thickness of at least 100 nm, preferably at least 150 nm.

28. Process according to any of aspects 19 to 27, wherein the resulting anticorrosion coating (1), whose main constituent is zinc, has a thickness of at least 1 μm, preferably a thickness in the range from 3 μm to 50 μm, more preferably a thickness in the range from 5 μm to 30 μm, particularly preferably in the range from 7 μm to 20 μm.

29. Process according to any of aspects 19 to 28, wherein the application of (i) titanium or (ii) titanium and one or more further metals to the steel substrate so as to result in a metallic intermediate layer (2) which covers the steel substrate and whose main constituent is titanium and/or the application of one or more further metals to the metallic intermediate layer so as to result in an anticorrosion coating (1) covering the intermediate layer is carried out by means of physical vapor deposition, preferably at a partial pressure of oxygen of less than 0.1 mbar, preferably less than 0.01 mbar, particularly preferably less than 0.001 mbar, and/or in a gas phase in which the proportion by volume of oxygen is less than 20% by volume, preferably less than 10% by volume, particularly preferably less than 1% by volume.

30. Process for producing a hardened component, preferably a hardened component according to any of aspects 12 to 18, comprising the following steps:

provision of a component according to any of aspects 1 to 12 or production of a component by a process according to any of aspects 20 to 31, treatment of the component provided or produced so as to result in the hardened component.

31. Process according to aspect 30, wherein the component provided or produced comprises, as steel substrate (3), a steel having a structure which can be transformed into a martensitic structure, preferably comprises a steel having a ferritic-pearlitic structure, particularly preferably a manganese-boron steel having a ferritic-pearlitic structure, and the treatment comprises:

a thermal hardening treatment in which the structure is transformed into a martensitic structure and preferably a mechanical treatment, preferably mechanical forming, before, during and/or after the thermal hardening treatment.

32. Process according to either of aspects 30 and 31, wherein the treatment comprises at least the following steps:

(i) a thermal treatment in which the structure of the steel substrate of the component provided or produced is kept at a temperature above Ac3 until the structure has been transformed completely or partially into an austenitic structure, (ii) mechanical forming of the component before, during and/or after the thermal treatment, (iii) cooling of the component from the temperature above Ac3 during and/or after the mechanical forming, preferably to a temperature of less than 100° C., so that a martensitic structure is obtained in the steel substrate, preferably at a cooling rate of >20 K/s, and/or comprises the following step:

mechanical treatment in which the porosity of the anticorrosion coating and/or of the metallic intermediate layer is decreased.

33. Use of titanium as main constituent of a diffusion barrier between a steel substrate (3) whose structure can be transformed into a martensitic structure and an anticorrosion coating (1) whose main constituent is zinc or manganese.

34. Use according to aspect 33 in a process for producing a hardened component, preferably a press-hardened component, particularly preferably a press-hardened component of a motor vehicle, very particularly preferably a press-hardened component selected from the group consisting of bumper cross beams, side impact beams, columns and bodywork reinforcements.

35. Use of a component according to any of aspects 1 to 11 for producing a hardened component according to any of aspects 12 to 18.

FIGURES

FIG. 1 schematically shows a component according to the invention comprising a steel substrate (3) whose structure can be transformed into a martensitic structure, a metallic intermediate layer (2) which covers the steel substrate and whose main constituent is titanium and also an anticorrosion coating (1) covering the intermediate layer (2). Details of an illustrative component according to the invention may be found in example 1 below.

Figure 2:
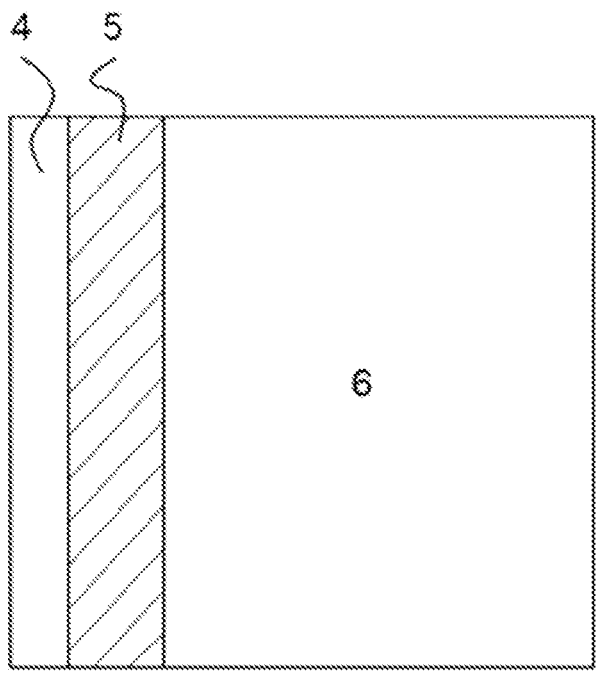
FIG. 2 schematically shows a hardened component according to the invention as is present after a thermal treatment (hot forming) of a component according to the invention.

FIG. 2 schematically shows a hardened component according to the invention as is present after a thermal treatment (hot forming) of a component according to the invention, where the steel substrate (6) and the anticorrosion coating (4) are joined by a transition zone (5), cf. example 2 below.

Figure 3:
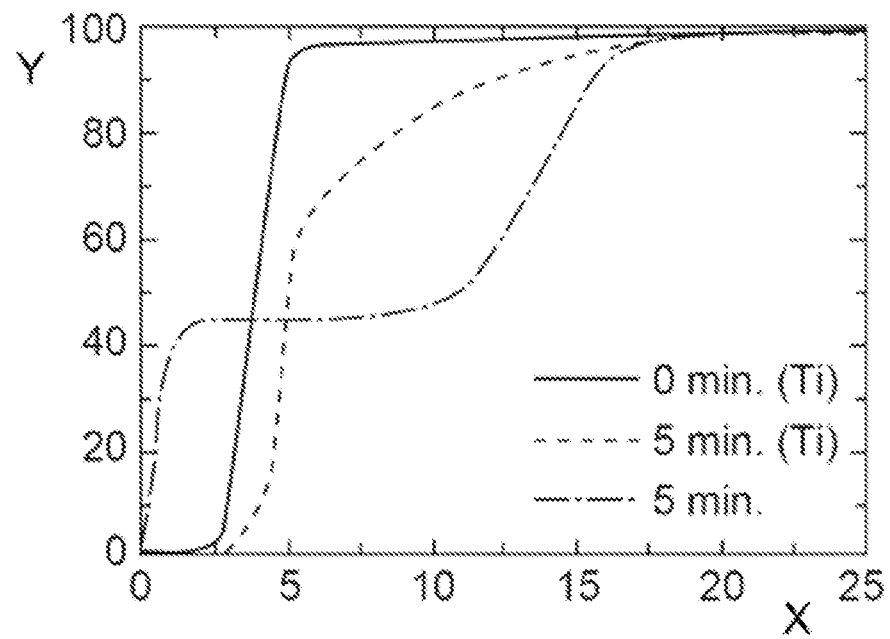
FIG. 3 shows the results of GDOES measurements (in accordance with ISO 11505:2012) on a component according to the invention, a hardened component according to the invention and, for comparison, a hardened component which is not according to the invention for the element iron (Fe).
Figure 4:
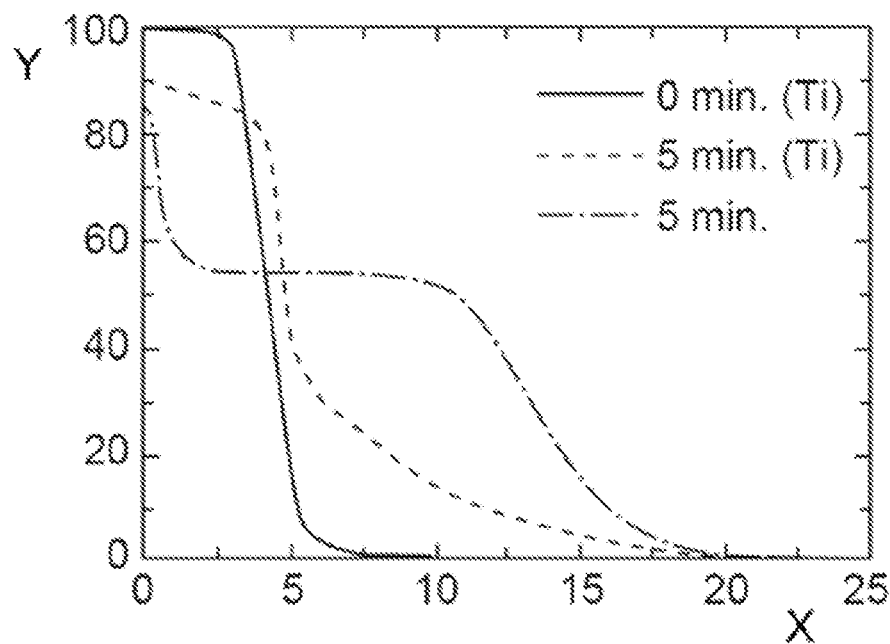
FIG. 4 shows the results of GDOES measurements (in accordance with ISO 11505:2012) on a component according to the invention, a hardened component according to the invention and, for comparison, a hardened component not according to the invention for the element zinc (Zn).
Figure 5:
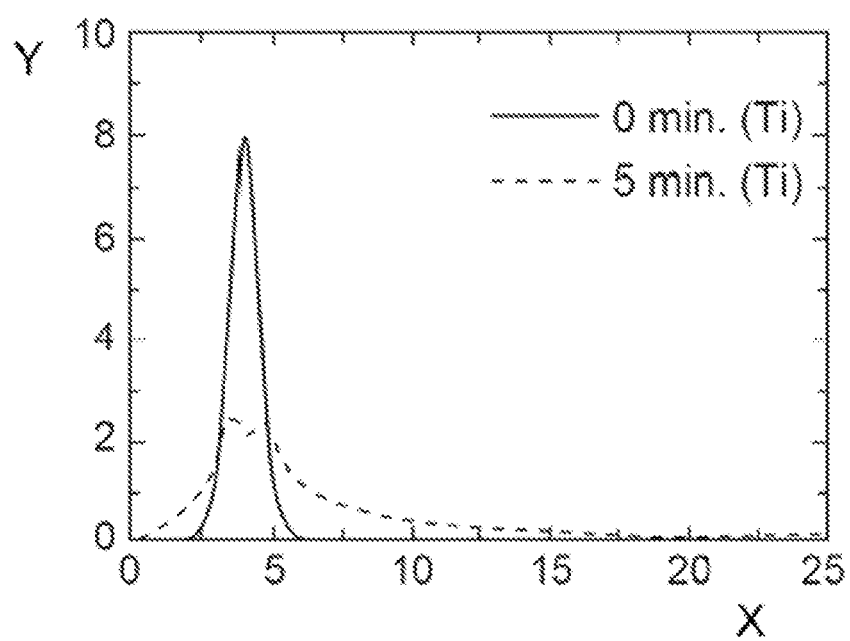
FIG. 5 shows the results of GDOES measurements (in accordance with ISO 11505:2012) on a component according to the invention and a hardened component according to the invention for the element titanium (Ti).

FIG. 3, FIG. 4 and FIG. 5 are cumulative calculated depictions based on illustrative experimental raw data.

FIG. 3 shows the results of GDOES measurements (in accordance with ISO 11505:2012) on a component according to the invention, a hardened component according to the invention and, for comparison, a hardened component which is not according to the invention for the element iron (Fe). The X axis indicates the distance from the specimen surface (i.e. the depth) in microns. The Y axis indicates the proportion by mass of iron (in percent) in the volume of the specimen examined in each case.

The solid line [0 min. (Ti)] represents the measured values determined on a component according to the invention (with intermediate layer composed of titanium). As steel substrate, use was made of a 22MnB5 substrate, the metallic intermediate layer (2) which covers the steel substrate and whose main constituent is titanium consisted of titanium (containing only unavoidable impurities) and the anticorrosion coating (1) covering the intermediate layer (2) consisted of zinc (containing only unavoidable impurities). The solid line in FIG. 3 corresponds to the solid lines in FIG. 4 and FIG. 5; the measured points on which the solid lines in FIG. 3, FIG. 4 and FIG. 5 are based came in each case from a joint GDOES measurement.

The broken line [5 min. (Ti)] represents measured values determined on a hardened component according to the invention. The hardened component measured was obtained from a component according to the invention by hot forming at 880° C. with a hold time of 5 minutes. The broken line in FIG. 3 corresponds to the broken lines in FIG. 4 and FIG. 5; the measured points on which the broken lines in FIG. 3, FIG. 4 and FIG. 5 are based came in each case from a joint GDOES measurement.

The dot-dash line [5 min.] represents measured values which were measured on a hardened component which was not according to the invention and was obtained from a corresponding component not according to the invention (without titanium intermediate layer) by hot forming at 880° C. with a hold time of 5 minutes. The steel substrate (3) here is, by way of example, a 22MnB5 substrate; a metallic intermediate layer (2) covering the steel substrate was not present here but instead the anticorrosion coating (1), here consisting by way of example of zinc, contacted the steel substrate directly. Experimental results for a corresponding component which is not according to the invention are not shown in FIG. 3. The dot-dash line in FIG. 3 corresponds to the dot-dash line in FIG. 4; the measured points on which the dot-dash lines in FIG. 3 and FIG. 4 are based come in each case from a joint GDOES measurement.

FIG. 4 shows the results of GDOES measurements (in accordance with ISO 11505:2012) on a component according to the invention, a hardened component according to the invention and, for comparison, a hardened component not according to the invention for the element zinc (Zn). The X axis indicates the distance from the specimen surface (i.e. the depth) in microns. The Y axis indicates the proportion by mass of zinc (in percent) in the respective volume of the specimen examined.

The solid line [0 min. (Ti)] represents measured values which were determined on a component according to the invention (with intermediate layer composed of titanium). A steel substrate, use was made of a 22MnB5 substrate, the metallic intermediate layer (2) which covers the steel substrate and whose main constituent is titanium consisted of titanium (containing only unavoidable impurities) and the anticorrosion coating (1) covering the intermediate layer (2) consisted of zinc (containing only unavoidable impurities).

The broken line [5 min. (Ti)] represents measured values determined on a hardened component according to the invention. The hardened component measured was obtained from a component according to the invention by hot forming at 880° C. with a hold time of 5 minutes.

The dot-dash line [5 min.] represents measured values measured on a hardened component which was not according to the invention and was obtained from a corresponding component by hot forming at 880° C. with a hold time of 5 minutes. The steel substrate (3) here is by way of example a 22MnB5 substrate; a metallic intermediate layer (2) covering the steel substrate was not present here but instead the anticorrosion coating (1), here by way of example consisting of zinc, contacted the steel substrate directly. Results on a corresponding component not according to the invention are not shown in FIG. 4.

FIG. 5 shows the results of GDOES measurements (in accordance with ISO 11505:2012) on a component according to the invention and a hardened component according to the invention for the element titanium (Ti). The X axis indicates the distance from the specimen surface (i.e. the depth) in microns. The Y axis indicates the proportion by mass of titanium (in percent) in the respective volume of the specimen examined.

The solid line [0 min. (Ti)] represents measured values determined on a component according to the invention (with intermediate layer composed of titanium). As steel substrate, use was made of a 22MnB5 substrate, the metallic intermediate layer (2) which covers the steel substrate and whose main constituent is titanium consisted of titanium (containing only unavoidable impurities) and the anticorrosion coating (1) covering the intermediate layer (2) consisted of zinc (containing only unavoidable impurities). The solid line in FIG. 5 corresponds to the solid lines in FIG. 3 and FIG. 4; the measured points on which the solid lines in FIG. 3, FIG. 4 and FIG. 5 are based come in each case from a joint GDOES measurement.

The broken line [5 min. (Ti)] represents measured values determined on a hardened component according to the invention. The hardened component measured was obtained from a component according to the invention by hot forming at 880° C. with a hold time of 5 minutes.

EXAMPLE 1—PRODUCTION AND EXAMINATION OF A COMPONENT ACCORDING TO THE INVENTION

A metallic intermediate layer composed of Ti (as example of a metallic intermediate layer which covers the steel substrate and whose main constituent is Ti) was applied in a thickness of about 250 nm to a 22MnB5 substrate provided (manganese-boron steel having a ferritic-pearlitic structure, as example of a steel substrate whose structure can be transformed into a martensitic structure) by means of physical vapor deposition (PVD). The application by means of physical vapor deposition was carried out at a partial pressure of oxygen of less than 0.001 mbar. The application of the metallic intermediate layer composed of titanium by physical vapor deposition was controlled in such a way that at least 95% of the area of the steel substrate was covered by the metallic intermediate layer.

A single about 5 μm thick Zn layer (as example of an anticorrosion coating covering the intermediate layer; the use of manganese or of zinc-manganese alloys is equally advantageous, as in-house studies have shown) was applied to this metallic intermediate layer.

FIG. 1 schematically shows the resulting configuration of the component produced by way of example, with the steel substrate (3), the metallic intermediate layer (2) which covers the steel substrate and whose main constituent is titanium and the anticorrosion coating (1) covering the intermediate layer (2). Covering of the metallic intermediate layer with the anticorrosion coating was carried out here in such a way that at least 95% of the area of the anticorrosion coating (1) facing the steel substrate (3) was in contact with the metallic intermediate layer (2) and thereby separated from the steel substrate (3).

The procedure described is illustrative of a process according to the invention for producing a component according to the invention.

The component obtained in this way was examined by GDOES measurement; the results are shown as solid lines (for iron, zinc or titanium) in FIG. 3, FIG. 4 and FIG. 5.

The measured values show that zinc is detected as the only metal at the component surface and is no longer detected below a depth of about 5 μm. Iron is detected only from a specimen depth of about 3 µm and is present as the only one of the metals under consideration here below a depth of about 5 µm.

The measured values for titanium (as material of the intermediate layer) have a maximum at a depth of about 4µm. The proportion by mass of titanium determined by GDOES does not attain 100%; this is, in particular, attributable to the large lateral extension of the measurement spot (diameter about 4 mm) relative to the layer thickness, due to which the signal is considerably broadened in respect of the depth resolution. As a result, the relative proportion by mass of titanium is underevaluated in the volume sampled in each case because of the measurement method selected.

Not everywhere along the depth profile do the proportions by mass of the elements iron, zinc and titanium recorded add up to 100%. The reason for this is, in particular, that zinc in particular oxidizes on the surface, so that oxygen is also present in the layer there. The proportion of oxygen is not shown in FIGS. 3, 4 and 5 for reasons of clarity.

EXAMPLE 2—PRODUCTION AND EXAMINATION OF A HARDENED COMPONENT ACCORDING TO THE INVENTION 2.1 Production of a Component According to the Invention A component which differs from the component described in example 1 only in respect of the thickness of the Zn anticorrosion coating was firstly produced; as a difference from the thickness of about 5 µm of the Zn anticorrosion coating selected in example 1, a thickness of about 10 µm was selected for the Zn anticorrosion coating. This procedure made the analytical results more readily comparable since the thickness of a Zn anticorrosion coating applied by PVD was reduced by compression (with reduction of the porosity) and also evaporation of zinc in the hot forming process to about half in in-house studies. Thus, the thicknesses of the Zn anticorrosion coating of the component of example 1 (without hot forming) and of the hardened component of example 2 (after hot forming) correspond approximately to one another.

2.2 Production of the Hardened Component According to the Invention by Hot Forming The component according to the invention produced as described in 2.1 was hardened in a hot forming process at 880° C. with an illustrative hold time of 5 minutes (so that an austenitic structure is formed, completely or partially, in the steel substrate) and subsequent cooling to give a hardened component according to the invention having a martensitic structure. FIG. 2 schematically shows the configuration of the resulting hardened component according to the invention.

2.3. GDOES Studies

The hardened component according to the invention was examined by means of GDOES; the results are presented as broken lines in FIG. 3, FIG. 4 and FIG. 5. The measurement results show the presence of a transition zone in which iron, titanium and zinc are present in the component according to the invention, with a change in the main metallic constituent from iron to zinc occurring from a region of the transition zone close to the steel substrate in the direction of the anticorrosion coating. The transition zone joins steel substrate and anticorrosion coating. These properties of the (very narrow, here about 5 µm thick) transition zone are attributable to the excellent diffusion barrier action of the metallic intermediate layer composed of titanium which was present in the component according to the invention (cf. section 2.1). The measurements clearly indicate that iron, zinc and titanium are present as alloy in the zone of the transition zone facing the steel substrate (according to the invention, manganese can equally well advantageously be a constituent of this alloy instead of zinc or in addition to zinc when it is selected as constituent of the anticorrosion coating). The proportion by mass of iron at a depth of about 2 µm, measured from the outer surface of the anticorrosion coating, is less than 5% (cf. FIG. 3). The proportion by mass of titanium has a maximum at a depth of from 3 to 5 µm, measured from the outer surface of the anticorrosion coating (cf. FIG. 5).

2.4. Comparison/Evaluation/Conclusion

Compared to comparative components or hardened comparative components which, with an otherwise analogous configuration, did not contain an intermediate layer (diffusion barrier) composed of titanium or did not contain a transition zone, the products according to the invention are characterized by, in particular, the penetration of zinc into the steel substrate being drastically decreased. At the same time, the migration of iron from the steel substrate into the anticorrosion coating was drastically reduced in the products according to the invention. Typical curves for comparative products (without intermediate layer) are plotted in FIGS. 3 and 4, in each case for hot forming at 880° C. with a hold time of 5 minutes. A person skilled in the art will be able to see that the reciprocal migration of zinc and iron in the comparative products was much more pronounced than in the products according to the invention. In the products according to the invention, the intermediate layer (diffusion barrier) composed of titanium has thus largely prevented such reciprocal migration.

EXAMPLE 3

The hardened component produced in example 2.2 and analyzed by means of GDOES as described in example 2.3 was subjected to supplementary wet chemical analysis. For this purpose, the anticorrosion coating was dissolved in acid and subsequently analyzed by means of IPC-OES (inductively coupled plasma optical emission spectrometry) in accordance with DIN EN ISO 11885:2009-09. The proportion of Fe in the anticorrosion coating (after heat treatment for 5 minutes) was determined and found to be (3.2±0.1)% by weight, based on the elements zinc, iron, aluminum, titanium and manganese taken into consideration. This result, too, clearly shows that the metallic intermediate layer composed of titanium has at least largely prevented diffusion of iron from the steel substrate into the anticorrosion coating.

The invention claimed is:
1. A component comprising:
a steel substrate having a structure that can be transformed into a martensitic structure,
a metallic intermediate layer which covers the steel substrate,
and
an anticorrosion coating covering the metallic intermediate layer, wherein the anticorrosion coating comprises one or more layers and at least a layer of the anticorrosion coating adjoining the metallic intermediate layer is metallic and differs in terms of material from the metallic intermediate layer, and wherein the metallic intermediate layer comprises greater than or equal to 90% by weight titanium, based on the total mass of the metallic intermediate layer.

2. The component as claimed in claim 1, wherein a main constituent of at least the metallic layer of the anticorrosion coating adjoining the metallic intermediate layer is at least one metal selected from the group consisting of zinc and manganese.

3. The component as claimed in claim 1, wherein at least 90% of an area of the anticorrosion coating facing the steel substrate is separated from the steel substrate by the metallic intermediate layer.

4. The component as claimed in claim 1, wherein the metallic intermediate layer has a melting point which is greater than 1000° C.

5. The component as claimed in claim 1, wherein metallic zinc is present in at least the metallic layer of the anticorrosion coating adjoining the metallic intermediate layer.

6. The component as claimed in claim 1, wherein the metallic intermediate layer has a thickness of at least 100 nm and not more than 500 nm.

7. The component as claimed in claim 1, wherein the melting point of at least the metallic layer of the anticorrosion coating adjoining the metallic intermediate layer is greater than or equal to 880° C.

8. The component as claimed in claim 1, wherein the metallic intermediate layer has a boiling point which is less than 4700° C.

9. The component as claimed in claim 5, wherein the proportion of metallic zinc in the anticorrosion coating is greater than or equal to 55% by weight, based on the total mass of the anticorrosion coating.

10. The component as claimed in claim 5, wherein the proportion of metallic zinc in the anticorrosion coating is greater than or equal to 96% by weight, based on the total mass of the anticorrosion coating.

11. The component as claimed in claim 1, wherein the melting point of at least the metallic layer of the anticorrosion coating adjoining the metallic intermediate layer is greater than or equal to 419° C.

* * * * *